US008689915B2

(12) United States Patent
Ye et al.

(10) Patent No.: US 8,689,915 B2
(45) Date of Patent: Apr. 8, 2014

(54) HEAT DISSIPATING SYSTEM FOR ELECTRIC VEHICLE DRIVE CONTROLLER

(75) Inventors: Yanzhang Ye, Guangxi (CN); Ben Cai, Guangxi (CN); Rijun Huang, Guangxi (CN); Libin Wei, Guangxi (CN); Zhong Zheng, Guangxi (CN)

(73) Assignee: Liuzhou Wuling Motors Co., Ltd. (CN)

( * ) Notice: Subject to any disclaimer, the term of this patent is extended or adjusted under 35 U.S.C. 154(b) by 158 days.

(21) Appl. No.: 13/150,340

(22) Filed: Jun. 1, 2011

(65) Prior Publication Data
US 2011/0297347 A1 Dec. 8, 2011

(30) Foreign Application Priority Data
Jun. 7, 2010 (CN) .......................... 2010 2 0217344

(51) Int. Cl.
*B60K 1/00* (2006.01)
(52) U.S. Cl.
USPC ........................................................ 180/65.1
(58) Field of Classification Search
USPC ............ 180/65.1, 65.265, 68.4, 65.21, 65.22
See application file for complete search history.

(56) References Cited

U.S. PATENT DOCUMENTS

| 5,388,423 | A | * | 2/1995 | Khelifa ........................ 62/238.3 |
| 5,463,294 | A | * | 10/1995 | Valdivia et al. ................ 318/432 |
| 5,481,433 | A | * | 1/1996 | Carter ........................... 361/690 |
| 5,536,972 | A | * | 7/1996 | Kato ............................. 257/706 |
| 5,567,991 | A | * | 10/1996 | Schantz et al. ................ 307/10.1 |
| 5,634,262 | A | * | 6/1997 | O'Donnell et al. ............. 29/606 |
| 6,704,201 | B2 | * | 3/2004 | Kasuga ......................... 361/704 |
| 7,589,400 | B2 | * | 9/2009 | Hozoji et al. ................. 257/673 |
| 7,796,389 | B2 | * | 9/2010 | Edmunds et al. ............. 361/700 |
| 7,812,487 | B2 | * | 10/2010 | Bi et al. ......................... 310/64 |
| 7,829,975 | B2 | * | 11/2010 | Hayasaka et al. ............. 257/621 |
| 7,932,624 | B2 | * | 4/2011 | Yoshida ..................... 180/65.21 |
| 8,284,257 | B2 | * | 10/2012 | Fukui ........................... 348/169 |
| 8,356,762 | B2 | * | 1/2013 | Tomikawa et al. ........ 237/12.3 R |
| 2009/0139781 | A1 | * | 6/2009 | Straubel ....................... 180/65.1 |
| 2009/0317680 | A1 | * | 12/2009 | Imamura et al. ................ 429/26 |

* cited by examiner

*Primary Examiner* — Hau Phan
(74) *Attorney, Agent, or Firm* — Cantor Colburn LLP

(57) ABSTRACT

The present invention provides a heat dissipating system for an electric vehicle drive controller. The heat dissipating system for electric vehicle drive controller includes: high power MOS transistors for controlling magnitude of power supplied to an electric vehicle drive motor and for switching current direction, and a radiator connected to bodies of the MOS transistors, the radiator being made of aluminum alloy material, and a surface of the radiator being plated with a metallic nickel layer. Compared with existing electric vehicle drive controller, the electric vehicle drive controller of the present invention has advantages of low operating temperature, high reliability and long service life.

5 Claims, 2 Drawing Sheets

HEAT DISSIPATING SYSTEM FOR ELECTRIC VEHICLE DRIVE CONTROLLER

CROSS REFERENCE TO RELATED APPLICATION

This application claims the benefit of priority to Chinese Patent No. 201020217344.5, entitled "HEAT DISSIPATING SYSTEM FOR ELECTRIC VEHICLE DRIVE CONTROLLER", filed on Jun. 7, 2010 with State Intellectual Property Office of PRC, which is incorporated herein by reference in its entirety.

FIELD OF THE INVENTION

The present invention relates to the field of vehicle appliance technology, and particularly relates to heat dissipating system for drive controller of electric vehicle.

BACKGROUND OF THE INVENTION

At present, energy consumption caused by vehicles accounts for approximately a quarter of the overall energy consumption in the world. With the economic development in developing countries, the number of owned vehicles is increasing rapidly, and environmental and energy problems caused thereby become more serious. Due to the influence of oil crisis, developed countries have been developing energy saving technologies, aiming to keep the energy consumption of industrial sectors under the level of about half of the GNP. As the world is under the threat of both energy and environmental crisis, vehicle industry is demanded to improve the energy efficiency of vehicles and reduce emission of pollutants. However, it is difficult to solve this problem only by improving the performance of existing internal combustion vehicles. Developing electric vehicle is one of effective ways to solve this problem. A controller, which provides power supply to a drive motor in an electric vehicle and controls the magnitude and the power and direction of the current, is the core of the electric vehicle. In such a controller, switching elements for controlling the magnitude of power supplied to the drive motor and the direction of the current are usually a plurality of MOS transistors which control energizing current and armature current of the drive motor, and the magnitude of the power supplied to the drive motor is controlled by duty ratio of "turning on" and "turning off" the MOS transistors. The control signals for "turning on" or "turning off" these MOS transistors are generally pulse-width modulated signals having a high switching frequency, and thus these high power MOS transistors will generate heat. In order to resolve the problem that the temperature rise of the high power MOS transistors due to the generated heat is too grate, a plurality of MOS transistors of the same type and the same batch are connected in parallel on both the upper arm and the lower arm of the armature under large current, in which a radiator with large heat exchange area is mounted on the bodies of the MOS transistors. For a good overall performance in heat dissipation, economical efficiency and manufacturability, the radiator is generally made of aluminum or aluminum alloy. In the electric vehicle drive controller, the radiator is also used as conductors for connecting to the MOS transistors. In operation, an electrical vehicle drive controller with such a structure may have a great temperature rise. In existing practical products all over the word, the operating temperature of this kind of electrical vehicle drive controller raises to a maximum above 90□. The high operating temperature of the electrical vehicle drive controller affects not only the service life of its own, but also the reliability and security of the vehicle.

SUMMARY OF THE INVENTION

The object of the present invention is to provide a heat dissipating system for electrical vehicle drive controller, which can resolve the problem that the temperature rise of the existing electrical vehicle drive controller in operation is too great.

In order to achieve the above object, the present invention provides a heat dissipating system for electrical vehicle drive controller. The heat dissipating system for electrical vehicle drive controller includes high power MOS transistors for controlling magnitude of power supplied to a vehicle drive motor and for switching current direction, and a radiator connected to bodies of the MOS transistors, the radiator being made of aluminous material, and being plated with a nickel layer at the portion contacting with the MOS transistors.

In the above solution, the thickness of the nickel layer is generally 3-10 μm, and the junction resistance of each of the MOS transistors is preferably less than or equal to 0.006 ohm. The radiator which is connected with the MOS transistors can also be pressed on another heat dissipating base plate, with a silicon fabric having good thermal conductivity padded between the radiator and the heat dissipating base plate.

The MOS transistor mentioned in the present invention refers to Metal-Oxide-Semiconductor field-Effect-transistor (MOSFET).

Compared with the prior art, the present invention which employs the above solution has the following advantages:

In an electric vehicle drive controller, the radiator is not only used for dissipating heat, but also used as a conductor. However, the surface of the radiator made of aluminum alloy is prone to be oxidized, resulting in an alumina layer with poor electrical conductivity, which may generate heat when a heavy current passes through. In the existing electric vehicle drive controller, the MOS transistors are in direct contract with the radiator made of aluminum alloy to conduct electricity, and while the current passing through, the oxide layer where the MOS transistors and the heat dissipater are contacted with each other may generate heat. In the present invention, a nickel layer is plated on the surface of the radiator made of aluminum alloy, thereby reducing the heat generation caused by the high contact resistance. The heat amount can be further reduced by employing MOS transistors with low junction resistance. Furthermore, the produced heat can be dissipated through the heat dissipating base plate to the free space and the vehicle frame by seamlessly connecting the heat dissipating frame, which is in direct contact with the MOS transistors, to the heat dissipating base plate by means of a silicon fabric with good thermal conductivity. By this solution, the heat amount is reduced and the heat dissipating condition is improved, hence the operating temperature of the electrical vehicle drive controller is decreased greatly. Under the same conditions, the operating temperature in stable status of the present invention is at least 30□ lower than the minimal operating temperature of existing electrical vehicle drive controller. With reduction in the operating temperature, the electrical vehicle drive controller is improved in terms of reliability and the service life.

DETAILED DESCRIPTION OF THE INVENTION

The present invention will be further described in details with reference to the examples shown in drawings.

The electrical circuit principle of the present electric vehicle drive controller is the same as that of the existing electric vehicle drive controller structure.

Figure 1:
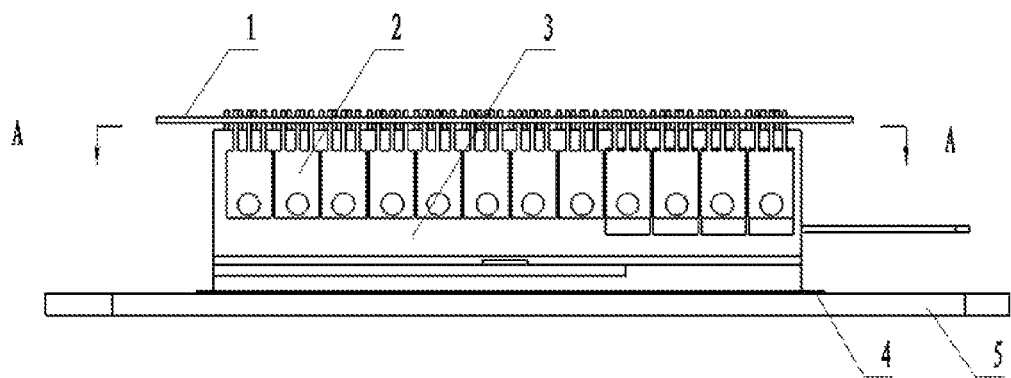
FIG. 1 is a front view of power elements in the electric vehicle drive controller according to the present invention.
Figure 2:
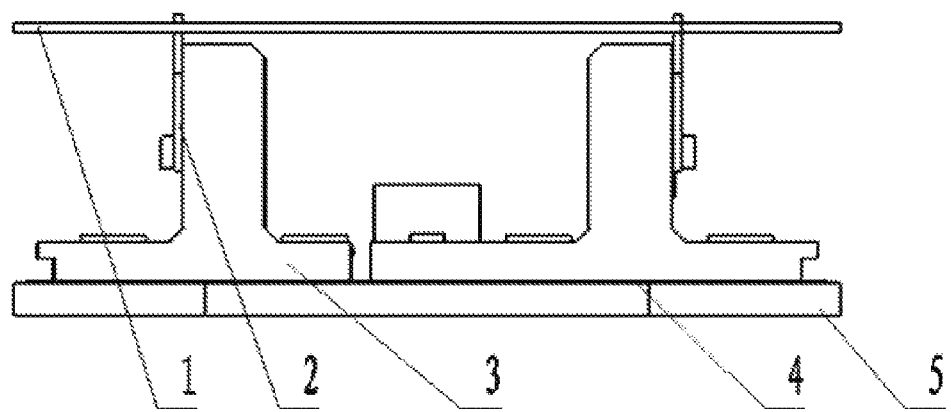
FIG. 2 is a left view of the power elements in the electric vehicle drive controller according to the present invention.
Figure 3:
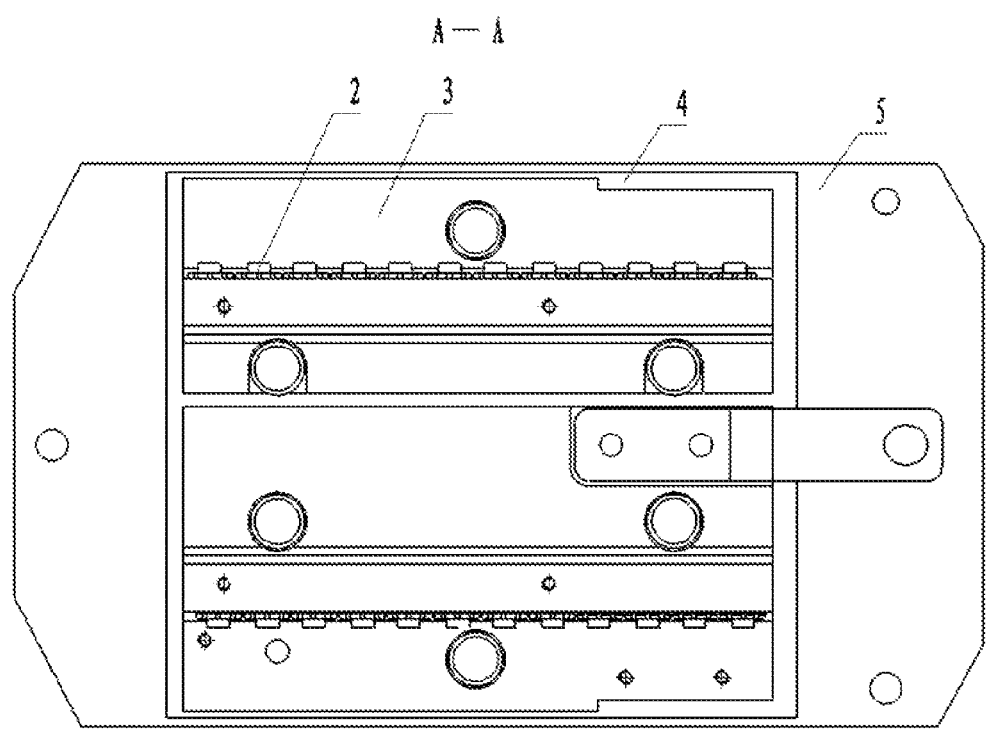
FIG. 3 is a sectional view along A-A direction in FIG. 1.

As shown in FIG. 1, there are totally 24 MOS transistors 2 in the power elements of the present vehicle drive controller. Each of the 24 MOS transistors 2 is an IRF4310-type MOS transistor with a junction resistance lower than or equal to 0.006 ohm. The 24 MOS transistors 2 are mounted on a circuit board 1 by soldering, in which every 12 MOS transistors 2 are mounted on a "T" shaped heat dissipating plate 3 made of aluminum alloy. A nickel layer with a thickness of 8 μm is plated on the outer surface of the heat dissipating plate 3, so as to keep the contact resistance between the MOS transistors 2 and the dissipating plate 3 relatively lower. The heat dissipating plate 3 is mounted on a metal base plate 5, with a silicon fabric of good thermal conductivity padded between the heat dissipating plate 3 and the metal base plate 5.

Although in this embodiment all the MOS transistors are IRF4310-type MOS transistors, trial results show that a similar technical effect can be achieved by replacing the above IRF4310-type MOS transistor with any of the IRF4110-type, IPP028N08N3-type, IPP037N08N3-type, IPB04CNE8N-type, IPP054NE8N-type, IPP04CN10N-type and IPP05CN10N-type MOS transistors with junction resistance lower than or equal to 0.006 ohm, in which, the operating temperature in stable status is at least 30☐ lower than in prior art.

The invention claimed is:

1. A heat dissipating system for an electric vehicle drive controller, comprising:

high power MOS transistors for controlling magnitude of power supplied to an electric vehicle drive motor and for switching current direction, and a radiator connected to bodies of the MOS transistors, the radiator being made of aluminum alloy material and serving as a conductor connected to the MOS transistors, and a surface of the radiator being plated with a metallic nickel layer, wherein the metallic nickel layer keeps a contact resistance between the high power MOS transistors and the radiator low and prevents an alumina layer from forming on the radiator.

2. The heat dissipating system for an electric vehicle drive controller according to claim 1, wherein the nickel layer has a thickness of 3-10 μm.

3. The heat dissipating system for an electric vehicle drive controller according to claim 2, wherein the radiator connected with the MOS transistors is pressed on a heat dissipating base plate, with a silicon fabric of good thermal conductivity padded between the radiator and the heat dissipating base plate.

4. The heat dissipating system for an electric vehicle drive controller according to claim 1, wherein the radiator connected with the MOS transistors is pressed on a heat dissipating base plate, with a silicon fabric of good thermal conductivity padded between the radiator and the heat dissipating base plate.

5. The heat dissipating system for an electric vehicle drive controller according to claim 1, wherein each of the high power MOS transistors has a junction resistance lower than or equal to 0.006 ohm.

\* \* \* \* \*